United States Patent [19]

Grabbe et al.

[11] Patent Number: 4,810,616

[45] Date of Patent: Mar. 7, 1989

[54] MANUFACTURING METHOD FOR INTEGRATED CIRCUIT CHIP CARRIERS

[75] Inventors: Dimitry G. Grabbe, Middletown; Iosif Korsunsky, Harrisburg, both of Pa.

[73] Assignee: AMP Incorporated, Harrisburg, Pa.

[21] Appl. No.: 83,611

[22] Filed: Aug. 7, 1987

Related U.S. Application Data

[62] Division of Ser. No. 899,710, Aug. 25, 1986, Pat. No. 4,703,920.

[51] Int. Cl.$^4$ .............................................. G03C 5/00
[52] U.S. Cl. .................................... 430/269; 430/311; 430/314; 430/394; 269/37; 269/254 R; 269/903; 269/115; 269/307
[58] Field of Search ............... 430/311, 322, 327, 320, 430/394, 269, 314; 156/293; 437/923; 269/37, 40, 41, 42, 43, 47, 115, 254 R, 307, 903, 53, 54.2, 167, 10

[56] References Cited

U.S. PATENT DOCUMENTS

| | | | |
|---|---|---|---|
| 2,815,813 | 12/1957 | Goldberg | 164/79 |
| 4,201,374 | 5/1980 | Gras | 269/37 |
| 4,232,815 | 11/1980 | Nakano et al. | 228/180 A |
| 4,393,131 | 7/1983 | Whalin et al. | 430/320 |
| 4,473,455 | 9/1984 | Dean et al. | 204/298 |
| 4,582,245 | 4/1986 | Cartwright | 228/180.2 |
| 4,582,309 | 4/1986 | Moxon et al. | 269/303 |

Primary Examiner—José G. Dees
Attorney, Agent, or Firm—James M. Trygg; Bruce J. Wolstoncroft

[57] ABSTRACT

Manufacturing method for integrated circuit chip carrier or similar devices comprises the steps of producing the substrate as a discrete part by pressing ceramic powder in a precision mold and sintering the pressed part. The discrete substrates are then placed in a work holder in which a plurality of substrates are precisely located with both surfaces of each substrate exposed. The manufacturing steps of metallizing the substrates, imaging, plating, resist removal, etching, and so on, can then be carried out on all of the substrates in the work holder simultaneously. The processes can be applied to both surfaces of each substrate simultaneously and in addition, further steps such as assembly of an IC chip to each substrate and wire bonding can be carried out while the substrates are in the work holder. The process greatly reduces the cost of manufacturing chip carriers, particularly the type having terminal pads on both surfaces of the substrate and conductors extending between the major surfaces.

5 Claims, 3 Drawing Sheets

MANUFACTURING METHOD FOR INTEGRATED CIRCUIT CHIP CARRIERS

This is a divisional application of application Ser. No. 899,710 filed Aug. 25, 1986, now U.S. Pat. No. 4,703,920.

This invention relates to manufacturing methods for producing integrated circuit chip carriers or similar devices and to work holders intended for use in the manufacturing method.

BACKGROUND OF THE INVENTION

Integrated circuit (IC) packages such as IC chip carriers commonly comprise a ceramic substrate having oppositely facing parallel major surfaces and peripheral side surfaces. An integrated circuit chip or similar device is mounted on one of the major surfaces and conductors extend from the chip to terminal pads which are located adjacent to the peripheral side surfaces. In some instances, it is desirable to provide terminal pads on both of the major surfaces and possibly circuitry or a circuit device on the second surface. In these instances, conductors must be provided on the side surfaces extending between the terminal pads on the two major surfaces.

A commonly used present manufacturing method comprises the steps of casting a slurry of the ceramic powder containing a binder on a plate to produce a thin sheet of ceramic which, when fired, is coherent and brittle. The binder is driven out during the firing operation and the powders are sintered. Thereafter, one surface of the sheet is scribed with a laser beam to outline blanks, usually square or rectangular, for the substrates. A plurality of blanks are thus outlined and it is possible to carry out steps such as metallization, imaging, plating, resist removal, and etching on an array of blanks during each process. In this manner, a plurality of blanks are produced from each scribed sheet of substrate material and the blanks can then be broken apart for further processing. This method of treating a plurality of blanks results in manufacturing economies over the alternative of producing individual blanks and processing each blank as a single unit.

If the chip carrier requires terminal pads on both surfaces of the substrate and conductors extending across the peripheral side surfaces, the individual substrates must then be further plated to produce the conductors on the side surfaces and the pads on the second surface. The manufacturing cost thus becomes much higher than is the case if conductors are required only on a single surface.

The present widely used manufacturing methods are therefore inconvenient and time consuming, particularly if substrates are being produced having conductors on both surfaces.

It has been recognized that it would be desirable to produce the individual blanks, not by the casting, firing, scribing, and breaking methods described above, but rather by pressing powders in a precision mold to produce the final shape of the blank and then firing the green pressed blank to drive off the binding material and sinter the powders. This alternative production method can yield superior surface finish and also permits the achievement of recesses in one or both of the major surfaces and in the side surfaces. For example, many substrates require a well or recess in the chip receiving zone and it is also necessary to provide recesses in the peripheral side surface for the conductors which may extend between the two major surfaces. Heretofore, the manufacture of the substrate blanks by pressing and sintering has been discouraged by the cost of producing the finished integrated circuit package for the reason that each discrete blank had to be separately handled and treated in all of the metallizing, imaging, plating, etc. processes required. The present invention is directed to the achievement of a manufacturing method which will overcome the disadvantages which have heretofore discouraged the use of discrete blanks in the manufacture of integrated circuit packages. The invention is also directed to the achievement of an improved work holder which is used in the method.

THE INVENTION

In accordance with one embodiment thereof, the invention concerns improvements to a method of manufacturing electronic devices, such as integrated circuit packages. Each device comprises an insulating substrate having oppositely facing major substrate surfaces and peripheral substrate side surfaces. The method generally comprises steps leading to the production of conductors on at least one of the major substrate surfaces and including at least one imaging step in which portions of the one major substrate surface are modified by the use of an imaging mask which is placed in a precise location against the one major substrate surface while radiant energy impinges on the substrate through the mask. The invention is particularly characterized by improvements to the method comprising the steps of producing the substrates as discrete parts by compacting powder in a precision mold and sintering the compacted powder. The substrates are thus produced as discrete parts and a plurality of the substrates are mounted at precisely predetermined locations in openings in a plate-like work holder. The work holder has a thickness which is substantially equal to, and less than, the thickness of an individual substrate so that both of the major surfaces of each substrate are accessible. Thereafter, at least some of the operations required in the manufacture of IC packages are carried out simultaneously on all of the substrates mounted in the work holder. The steps would include an imaging step which is carried out by placing a single mask having a plurality of individual images thereon against the work holder, with each one of the individual images precisely located against one of the substrates. If the integrated circuit package requires conductors on both of the major surfaces, operations can be performed on both substrate surfaces, simultaneously if desired.

In accordance with a further aspect, the invention comprises a work holder for holding a plurality of substrates during the manufacture of electronic devices such as integrated circuit chip carriers, each substrate comprising a flat rectangular insulating body having oppositely facing parallel major substrate surfaces and peripherally extending side surfaces which intersect at substrate corners. The work holder comprises a flat plate having oppositely facing parallel major work holder surfaces. The thickness of the plate, as measured between the major surfaces, is substantially equal to, and less than, the thickness of an individual substrate. A plurality of substrate receiving openings extend through the plate, each opening being dimensioned to receive a substrate and each opening has opening walls which extend normally of the major work holder surfaces. Locating means comprising portions of the opening walls are provided against which a substrate is positioned thereby precisely to locate the substrate in the opening. Additionally, spring means are provided adjacent to each opening for biasing a substrate in the opening against the locating means, the spring means being between the major work holder surfaces and not extending beyond the major work holder surfaces so that masks can be positioned against both of the major substrate surfaces. Registration markings are provided on the work holder for registering the masks and other devices with substrates positioned in the openings, the registration markings being on both of the work holder major surfaces to locate masks against each of the surfaces.

THE DRAWING FIGURES

THE DISCLOSED EMBODIMENT

Figure 1:
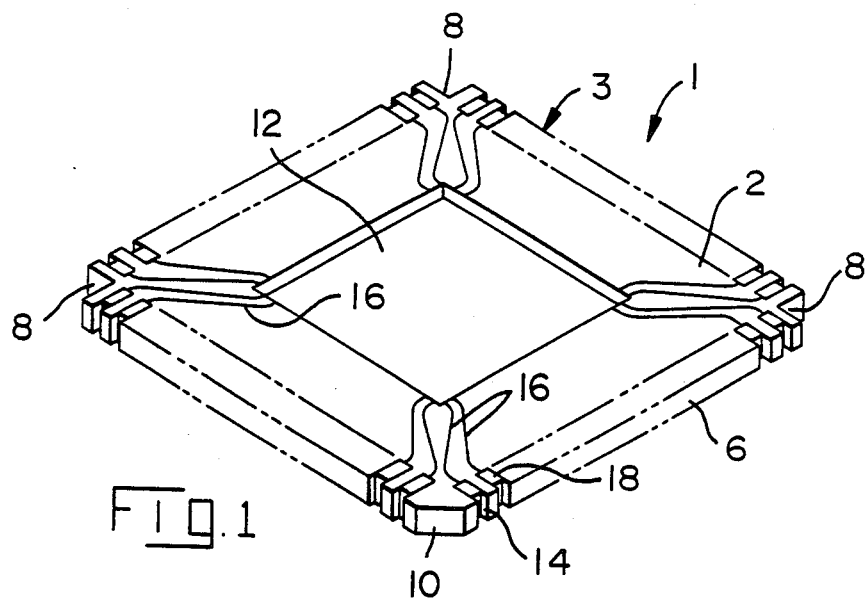
FIG. 1 is a perspective view of a substrate having metallization on the upper and lower surface thereof and having a well in the circuit receiving zone of one of the major surfaces.

FIG. 1 shows a partially manufactured IC chip carrier 1 comprising a square ceramic substrate 3 having upper and lower major substrate surfaces 2, 4 as viewed in the drawing, and peripheral side surfaces 6 which intersect at corners. Three of the corners are notched as shown at 8 and the fourth corner is beveled as shown at 10. These notches and this beveled surfaces are provided in accordance with an industry standard so that the substrate can be placed in a chip carrier socket in a precise position. These notches 8 and beveled surface 10 also serve to position individual substrates in a work holder as will be described below.

Figure 3:
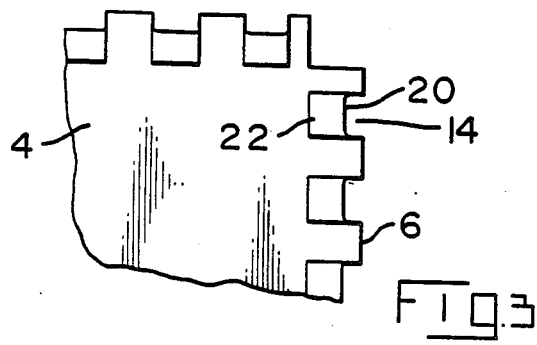
FIG. 3 is a view showing a corner portion of the lower surface of the substrate.

Recesses 14 are provided in the side surfaces 6 and extend between the two major substrate surfaces 2, 4. A centrally located well 12 is provided in the major substrate surface 2 and conductors 16 extend on the surface 2 from this well to terminal pads 18 which are adjacent to the side surfaces 6. Conductors 20 are also provided in the spaced-apart notches 14 in the side surfaces and extend to terminal pads 22 on the lower major substrate surface 4 as shown in FIG. 3. The conductors on the side surfaces as shown at 20 are confined to the grooves and the spaces between the grooves are not metallized. It is also common to metallize the surface of the well 12.

In accordance with the method of the present invention, the ceramic substrate 2 is produced by a pressing and molding operation in which ceramic powder, usually alumina, is pressed in a precision mold to the precise shape needed for the substrate. The green or unsintered molded part is then fired at an extremely high temperature and the finished hard, dimensionally stable substrate as shown in FIG. 1 is produced. The metallization described above is then produced on the surfaces of the substrate by means of a work holder 24 which will now be described.

The work holder comprises a flat relatively thin plate of stainless steel or the like, having oppositely facing work holder surfaces 26, 28 and a plurality of substrate receiving openings 30 which are arranged in an array in the plate. These openings are precisely located with reference to registration point 32, three such registration points being shown in FIG. 4. These registration points serve to locate the individual openings 30 and also serve to locate masks or other devices used in the manufacturing process. The openings 30 have opening walls 31 which extend normally of the surfaces 26, 28 and which intersect at corners. Three of the corners have projections 34 which are dimensioned to enter the notches 8 of the substrate as shown in FIG. 5. The remaining corner is provided with a cantilever spring 36 having a fixed end 38 and a free end 40. The spring extends diagonally with respect to the corner of the substrate on which the beveled surface 10 is provided and the free end 40 is against this beveled surface. When a substrate is placed in an opening 30, the cantilever spring 40 will bias the substrate against the projection 34 at the opposite corner of the opening and the remaining projections will limit rotary motion of the substrate in its opening.

It is important that the thickness of the work holder plate as measured between the surfaces 26, 28, be substantially equal to, and no greater than, the thickness of an individual substrate. In fact, it is preferable that the plate have a thickness which is substantially equal to, and less than, the thickness of an individual substrate so that the major surfaces of the substrate will be coplanar and will be slightly above the surfaces of the plate. It is also important that the spring member not project above the surrounding surface portions 26,28 of the plate for reasons which will be discussed below.

It will be apparent that a high degree of precision is required in the manufacture of the work holder and such precision can best be obtained when the plate is produced from sheet metal by use of EDM techniques. If the plate is of ceramic, it is produced by laser cutting. When the plate is metal, the openings are cut by EDM techniques and the springs are defined by EDM cuts on each side of the spring as apparent from FIG. 5. The registration marks 32 are similarly produced by EDM techniques and are defined by the crossing of two lines which extend entirely through the plate so that registration marks are provided on both surfaces. A separate spring would be provided for a ceramic plate.

While steel having good spring characteristics such as a suitable stainless steel, is the preferred material for the work holder, work holders might also be produced from ceramic, glass, or even plastic. If these materials are used, it would be necesary to provide the spring as a separate member in which case it is essential that the spring not project above the surface of the work holder plate.

Figure 2:
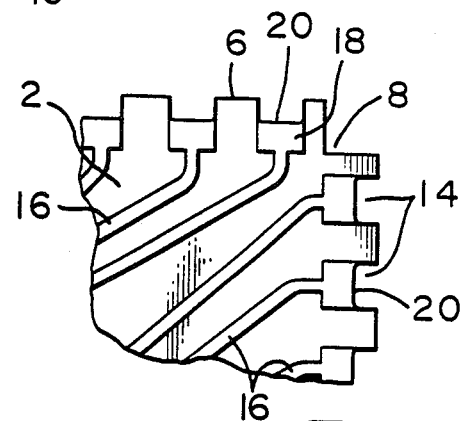
FIG. 2 is an enlarged fragmentary view showing a corner portion of the upper surface of the substrate of FIG. 1.
Figure 4:
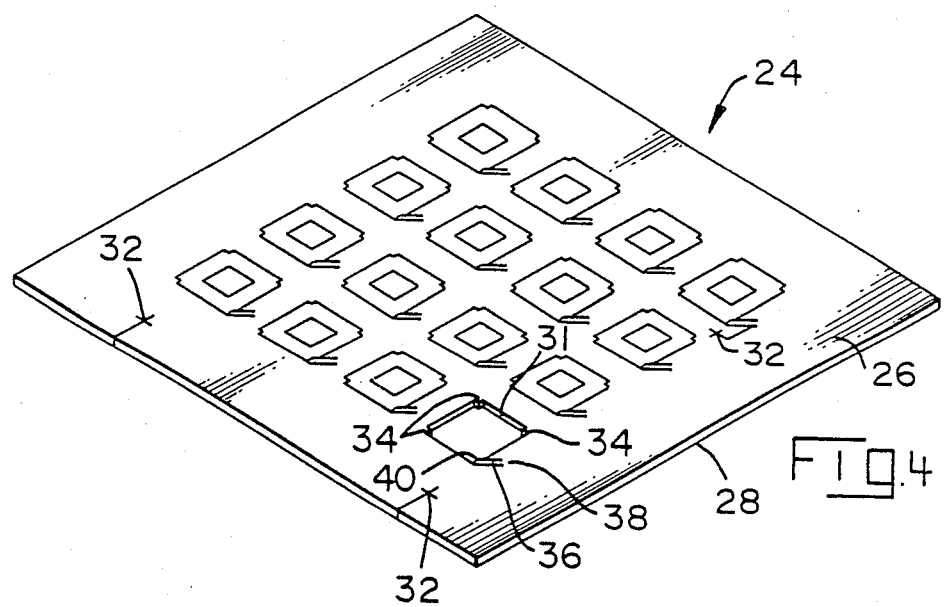
FIG. 4 is a perspective view of a work holder in accordance with the invention having substrates mounted in all but one of the substrate receiving openings thereof.
Figure 5:
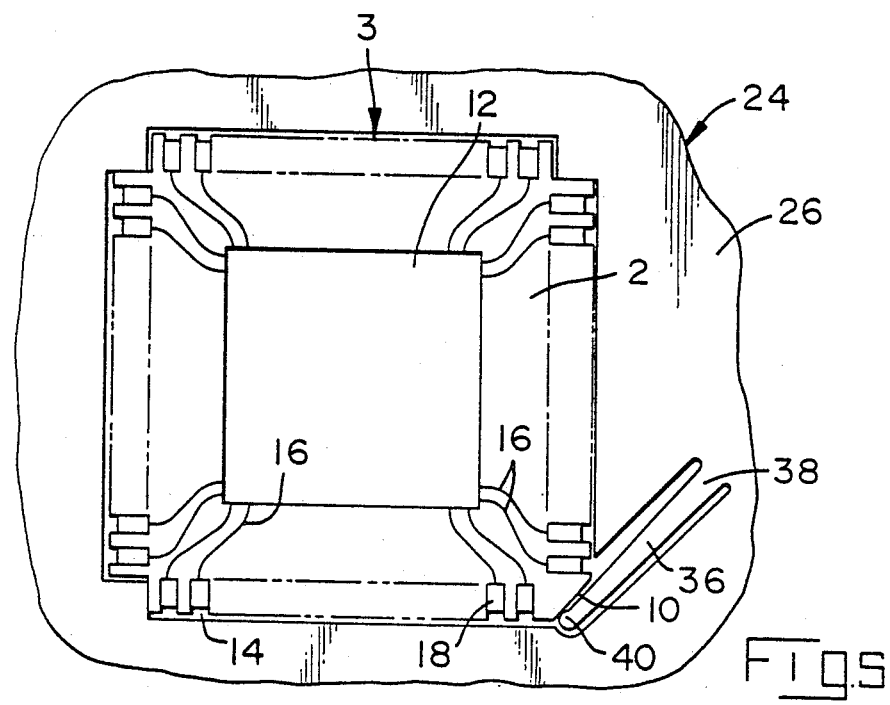
FIG. 5 is an enlarged planned view showing one of the substrate receiving openings with a substrate mounted therein.

In the practice of the method of the invention, individual substrates produced by pressing and sintering as described above are placed in the work holder as shown in FIG. 4. The work holder with the substrates therein can then be treated as a single unit and carried through the various steps required in the production of a finished chip carrier. Thus all of the individual substrates can be metallized in a single metallizing operation and can be provided with images by the use of masks, they can be plated, the resist applied as a result of the imaging step can be removed, and the etching processes carried out. When these commonly known steps are carried out, metallization and plating will be provided on the peripheral side surfaces 6 of the substrates in the work holder as well as in the grooves 14 as shown at 20 in FIG. 2. It is necessary to remove the metallization on the "lands" between the grooves 14, and this can be carried out by simply removing each substrate from the work holder and grinding the surfaces 6 to remove any metal deposited thereon. This grinding operation would normally be carried out after the etching operation which is to say after all of the conductors shown in FIGS. 1-3 have been applied to the surfaces 2 and 4.

The substrates can be returned to the work holder and additional operations in the manufacture of the chip carriers can be carried out. For example, the integrated circuit chips can be placed in the wells 12 and soldered thereto. The wire bonding operations during which the chip is connected to the conductor 16 can be carried out while the substrates are in the work holder and finally, the assembly of other parts to the finished package can be carried such as assembly to the cover and/or encapsulation. Under some circumstances, it is possible to carry out testing procedures after the package has been completely manufactured and while it is still in the work holder, In the foregoing description, it is assumed that a relatively complex shape of substrate is being processed, that is a substrate having the recesses 14 on its side surfaces 6, having a central well 12, and having terminal pads 18, 22 on both of its surfaces in addition to conductors 20 extending between the surfaces. The present invention can be used to advantage, however, if relatively simpler types of substrates are being processed such as substrates which do not have a central well and which do not have the recesses 14 on the side surfaces 6 or terminal pads on the lower surface. As noted above, it is a distinct advantage in itself if the individual substrates can be produced by pressing and sintering discrete parts rather than from a sheet of fired ceramic which must be scribed and broken.

The advantages of the practice of the invention stem from the fact primarily that the individual substrates can be produced as discrete parts at lower expense than can substrates be produced by the prior art casting and breaking method. Furthermore, the complexity of the shape of the substrate, that is whether it has a well or requires recesses as shown at 14, is of no significance and the designer need not consider the cost of the substrate regardless of the complexity of its shape. Notwithstanding the fact that the substrates are produced as discrete parts, they can be treated during the subsequent manufacturing steps in groups during the initial metallization and masking steps as well as the final assembly steps.

Figure 6:
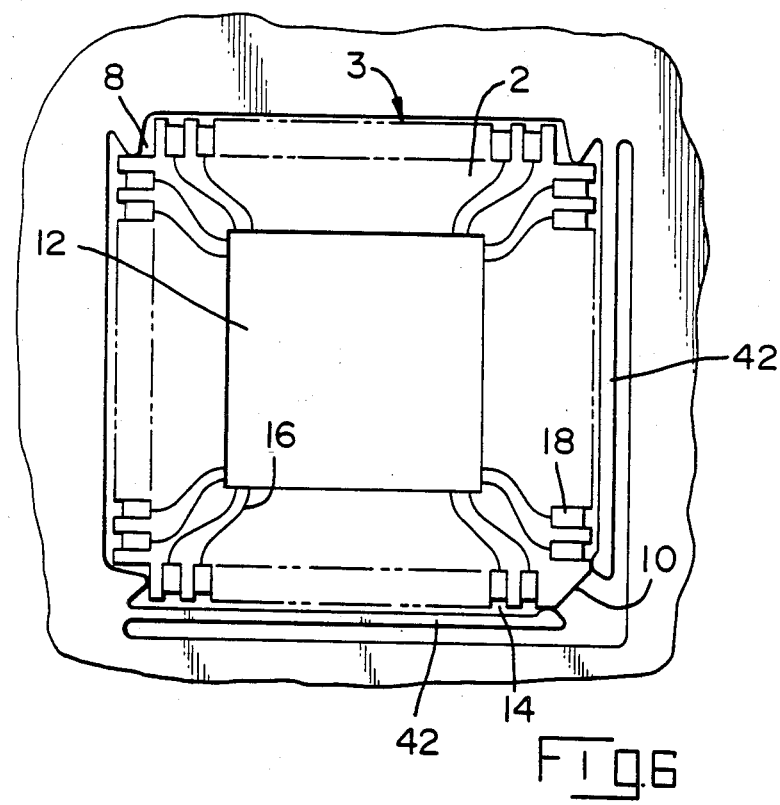
FIG. 6 is a view similar to FIG. 5 showing an alternative embodiment.

FIG. 6 shows an alternative embodiment in which two springs 42 are provided for each of the openings 30. Each of the springs extends parallel to one of the adjacent sides of the opening 30 so that the ends of the springs will bear against the beveled corner of the substract.

We claim:

1. A method of processing a plurality of substrates, the substrates having at least three points of mechanical reference, the method comprising the steps of:
    mounting the plurality of substrates into a plate-like work holder having a number of apertures therein, the work holder having a thickness which is less than the thickness of each individual substrate, each aperture having at least three reference points for locating the substrates therein;
    resiliently maintaining the substrates in the apertures by means of a spring member, such that the three points of mechanical reference of the substrate are aligned with the three reference points of the aperture, the spring member is integral with the work holder and cooperates with the side surfaces of the substrate,
    performing at least some of the operation required in the manufacture of the substrate simultaneously on all of the substrates mounted in the work holder.

2. Improvements to a method as set forth in claim 1 wherein the operations are performed on both of the major substrate surfaces simultaneously.

3. Improvements to a method as set forth in claim 2 wherein the operations include an imaging step, the imaging step being carried out by placing a single mask having a plurality of individual images thereon against the work holder with each one of the individual images precisely located against one of the substrates while radiant energy impinges on the substrates through the mask.

4. Improvements to a method as set forth in claim 1 wherein the substrates can be removed from, and returned to, the work holder, as required for various operations.

5. Improvements to a method as set forth in claim 1 wherein after the substrate has been completely manufactured, testing is performed on the substrate while it is maintained in the work holder.

* * * * *